United States Patent [19]

Spencer

[11] Patent Number: 4,658,161

[45] Date of Patent: Apr. 14, 1987

[54] SPLIT PHASE LOOP

[75] Inventor: John R. Spencer, Loveland, Colo.

[73] Assignee: Hewlett-Packard Company, Palo Alto, Calif.

[21] Appl. No.: 765,731

[22] Filed: Aug. 13, 1985

[51] Int. Cl.$^4$ .................. H03K 5/13; H03K 5/159
[52] U.S. Cl. .................. 307/603; 307/269; 307/480; 307/511; 307/601; 307/602; 307/605
[58] Field of Search .............. 307/269, 480, 600, 601, 307/602, 511, 603, 605

[56] References Cited

U.S. PATENT DOCUMENTS 3,553,484   1/1971   Gassmann ........................ 307/602
4,090,096   5/1978   Nagami ............................. 307/269
4,463,440   7/1984   Nishiura et al. ................... 307/269
4,489,342  12/1984   Gollinger et al. ................. 307/605
4,496,861   1/1985   Bazes ............................... 307/605
4,504,749   3/1985   Yoshida ............................ 307/603

Primary Examiner—John S. Heyman
Attorney, Agent, or Firm—Bloor Redding, Jr.

[57] ABSTRACT

An apparatus and method are described for generating a plurality of clock edges from a reference clock signal. The clock edges which are generated are locked in phase with the reference clock signal. The edges may be at any integral or nonintegral multiple of the reference clock frequency.

11 Claims, 12 Drawing Figures

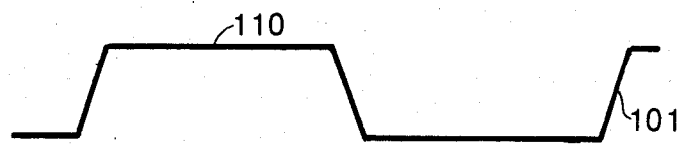
FIG 1
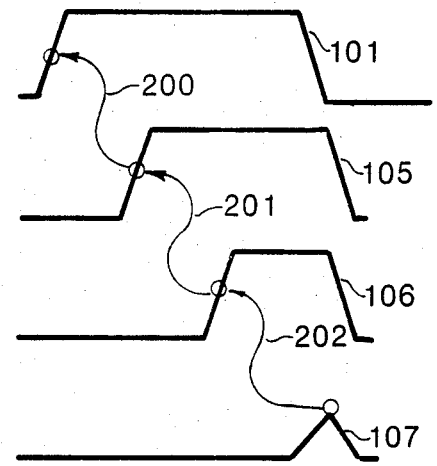
FIG 2
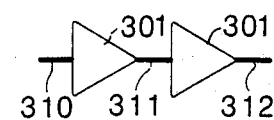
FIG 3
FIG 4

SPLIT PHASE LOOP

BACKGROUND OF INVENTION

In large digital logic systems, reference clocks are used to synchronize and coordinate the transmission of digital logic signals between digital logic devices. The digital logic system will function properly only when all the signals used by the system have defined logic states. This is particularly true on system busses such as memory data and address busses. The logic state of certain signals may be defined only at specific times, for example, the logic state of data signals generated by a random access memory, RAM, may only be defined after a memory access delay.

A computer, a typical digital logic system, accesses memory by performing the following steps. First, the computer supplies an address to the memory address bus. At a predetermined fixed period of time later the address bus stabilizes and the address is defined. Second, address decode logic using the address from the address bus converts the address into a particular RAM cell and a predetermined period of time later transfers the contents of the memory cell to a memory data bus. This period of time is known as the RAM access time. Finally, the data bus signals must be permitted to stabilize before the computer may use the data.

A typical computer will attempt to perform a complete memory access within two reference clock cycles. The computer will have a reference clock with a period 2t. The computer will supply the address and address access signal to memory address bus at time 0t, clock the contents of RAM onto the memory data bus at time 3t, and latch the RAM contents into the computer from the memory data bus at time 4t. This approach works well as long as the RAM access time, m, is less than or equal to the time 4t. If slower, less expensive RAM with an access time of greater than 4t is used, a serious problem develops because no clock edge of the reference clock can be used to transfer the data read from the data bus at time 4t.

Various prior art solutions have been used to address this problem. First, a slower reference clock may be used. The clock frequency is reduced to the point where the RAM access time is again less than or equal to the period 2t. This of course reduces the throughput of the entire digital logic system and is therefore undesirable.

A second solution is to use a higher frequency clock. A clock with considerably higher frequency will have additional edges from which a designer may choose an edge to clock the address into the RAM and address decode logic and still have a clock edge available for transferring the data read from the RAM onto the data bus within the required time. However, higher clock frequencies cause other problems, for example, increased system power, radio frequency interference and clock skew. Clock skew refers to the phase shift of the reference clock as it is transmitted throughout the digital system. The higher the clock frequency, the higher the percentage of the clock period potentially affected by clock skew. Therefore, clock skew with higher frequency clocks is more likely to cause the system to malfunction.

A third solution is to use a technique which delays one or more edges of the reference clock. This technique includes using an RC circuit or delay line to delay the reference clock. This technique, however, has problems with accuracy and sensitivity to temperature and process variations which cause the delay generated to vary. Any variation in the delay may cause the digital logic system to malfunction.

A fourth solution is to use a local frequency multiplier or phase lock loop to generate the higher frequency clock signal with its addition timing edges. These solutions, while generating the needed additional edges at a stable frquency do not provide the precise phase control with respect to the reference clock and therefore require some additional synchronizing scheme to maintain a stable reference to the reference clock.

A fifth solution is to use an asychronous interface with an arbitrator that synchronizes the memory signals to the nearest clock edge in the synchronous system. If an asynchronous signal occurs too close to a clock edge, the arbitrator will delay the signal to the next clock edge. Therefore, the system must tolerate a delay of an entire clock cycle. This method is unacceptable for high performance synchronous memory systems and the like.

A need exists for an accurate, stable, predictable, flexible, and temperature and process independent means for generating additional clock edges from a reference clock signal.

SUMMARY

In accordance with the preferred embodiment of the present invention, an apparatus and method are described for generating a plurality of clock edges from a reference clock signal. The generated clock edges are locked in phase with the reference clock signal. The apparatus and method differ from the prior art in that the generated clock edges are held in phase with the reference clock signal and may be any integral or non-integral multiple of the reference clock frequency.

The present invention is superior to the prior art in several ways. First, the apparatus and method are considerably more accurate than the prior art. Accuracy of plus or minus 0.1 nanoseconds is achievable with the preferred embodiment of the present invention. This accuracy is achieved without costly custom trimming or other specialized treatment. Second, the apparatus and method permit the generated clock edges to be divided into any integral or non-integral multiple of the reference clock signal frequency. In fact, clock edges may be placed anywhere within the clock phase of the reference clock being used. Finally, the the critical timing aspects of the apparatus and method are controlled by current sources and capacitors which are easily integratable into integrated and matched circuits.

DESCRIPTION OF DRAWINGS

FIG. 1 is a timing diagram of a reference clock signal.

FIG. 2 illustrates the timing relationship between the reference clock signal and clock edges generated from the reference clock signal.

FIG. 3 is a functional block diagram of a circuit having fixed delay elements.

FIG. 4 is a functional block diagram in accordance with the preferred embodiment of the present invention.

DESCRIPTION OF THE PREFERRED EMBODIMENT

Figure 5:
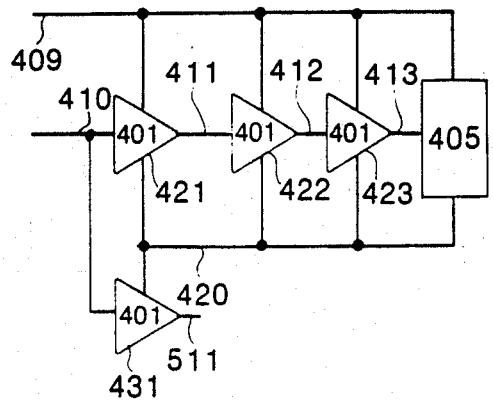
FIG. 5 is the functional block diagram of FIG. 4 with additional elements to support large current loads.

A method or apparatus in accordance with the present invention begins with a reference clock signal. FIG. 1 is a timing diagram of a reference clock signal. Signal 101 is the reference clock signal. Signal 102 is a non-overlapping clock signal used by the preferred embodiment of the present invention. Signal 102 is typically available in most digital logic systems and may be generated from signal 101 by several techniques which are well known in the prior art. The reference clock supplies the reference timing from which multiple clock edges are generated. In the preferred embodiment of the present invention, the generated clock edges are generated for phase 110 of signal 101. The method and apparatus of the present invention are equally applicable to dividing the opposite phase of the clock signal.

FIG. 2 illustrates the timing relationship between the reference clock signal 101 and generated clock edges 105 and 106. Time intervals 200, 201 and 202 are carefully controlled by the present invention. In the preferred embodiment of the present invention, time intervals 200, 201, and 202 are of equal duration, although the present invention is capable of operating with unequal time intervals.

The critical timing of the preferred embodiment is developed from the rising edge of the reference clock signal to the rising edge of the alternate clock signal. The alternate clock signal may either be a non-overlapping clock signal or an inverted reference clock signal. The preferred embodiment of the present invention uses a non-overlapping clock signal for the alternate clock signal. Increased accuracy is available when a controlled non-overlapping clock signal is used because of the method by which the non-overlapping clock signal is typically generated. This method causes the non-overlapping clock signal to be more precisely coupled to the reference clock signal than an inverted reference clock signal. The inverted reference clock signal is subject to a gate delay caused by process variations and the threshold voltage of the inverter used to generate the inverted reference clock signal. Signal 102 is the alternate clock signal of the preferred embodiment.

FIG. 3 is a function block diagram of a circuit having fixed delay elements 301. The generated edges 105 and 106 could be obtained from a circuit functionally similar to that shown in FIG. 3. The reference clock signal 101 would be supplied to input 310 and the generated edges 105 and 106 would be obtained from delay element outputs 311 and 312 respectively. However, this approach lacks the control over the accuracy of the intervals 200, 201 and 202 required for large digital logic systems. Accuracy over the intervals 200, 201, and 202 can only be obtained from the circuit shown in FIG. 3 by expensive control over temperature, process, and circuit topology.

FIG. 4 is a functional block diagram in accordance with the preferred embodiment of the present invention. The apparatus comprises four elements: three variable delay elements 401 and a comparator 405. The number of delay elements required by the present invention is equal to one plus the number of additional clock edges needed in the digital logic system. In the preferred embodiment of the present invention, these variable delay elements are used to generate two additional clock edges each having a uniform delay interval. The third delayed edge is used for control since the rising edge of the alternate clock would be used in the system for this edge. FIG. 2 illustrates these timing relationships. These variable delay elements are cascaded together and connected to the comparator 405. A reference clock 410 is then supplied to the first variable delay element. The alternate clock signal 409 is supplied to each variable delay element 401 and the comparator 405. A control signal 420 is generated by the comparator 405 and supplied to each variable delay element 401.

The method of operation of the preferred embodiment of the present invention is as follows. The reference clock 410 is supplied to the first variable delay element 421. The delay element generates signal 411, a delayed version of the reference clock 410. The signal 411 is supplied to the second variable delay element 422 which generates signal 412, a twice delayed version of the reference clock 410. Signal 412 is supplied to the third variable delay element 423 which generates signal 413, the last delayed version of the reference clock 410. Signal 413 corresponds with the inverse of reference clock 410. The rising edge of signal 413 is then compared to the rising edge of the alternate clock signal 409 by the comparator 405. If the two edges occur at the same exact time, no adjustment of the delay elements' delay interval is required and the generated edges 105 and 106 are precisely timed with respect to the reference clock signal. However, if the signal 413 leads the rising edge of the alternate clock signal 409, then the delay interval of each variable delay elements needs to be increased in order to restore the coincidence between the leading edge of signal 413 and the leading edge of the alternate clock signal 409. If the signal 413 lags the rising edge of the alternate clock signal 409, then the delay interval of each variable delay element needs to be decreased. The comparator 405 generates control signal 420 which is supplied to each variable delay element to control the delay interval.

The preferred embodiment of the present invention has a fixed timing period corresponding to the difference in time between the rising edge of the reference clock signal and the rising edge of the alternate clock signal. Any error is divided by the number of variable delay elements to arrive at the timing error between an actual generated edge and a theoretical generated edge. This error is so small as to be unimportant in most digital logic systems.

For light current loads, the generated edges 105 and 106 may be obtained directly from signals 411 and 412 respectively without serious added delay. However, if the current load is capable of slowing the rise time of the signal 411 and 412, then the load is likely to affect the accuracy of the generated edges and another approach must be taken.

FIG. 5 is the functional block diagram of FIG. 4 with an additional element to support large current loads.

For large loads, one or more variable delay elements 401 may be added in parallel with the original variable delay elements to generate the delayed edges without affecting the main timing loop. Signal 511 generated by variable delay elemet 425 is exactly equivalent to signal 411 given the same load, however, the load placed on element 425 cannot affect the timing since the timing is controlled by the main timing loop. However, the load may still cause the slope of the generated edge to change. Another alternative is to place equally loaded high current drivers in the main timing loop following each variable delay element. In this manner, the feedback around the main timing loop holds the loop timing exactly even under heavy loads and compensates for driver delay.

Figure 6:
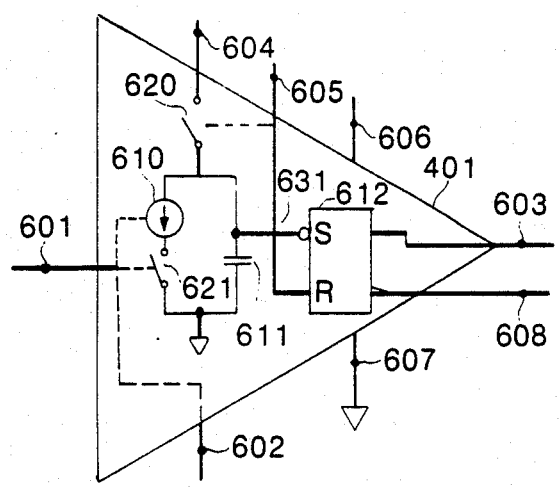
FIG. 6 is a functional block diagram of a variable delay element.

FIG. 6 is a functional block diagram of the variable delay elemet in accordance with the preferred embodiment of the present invention. The variable delay element 401 consists of variable current source 610, capacitor 611, negative edge triggered regenerative flip-flop 612 and switches 620 and 621. The variable delay element 401 is controlled by input signal 601, control signal 602, reference voltage 604, and reset signal 605. Power is supplied through lines 606 and 607. The variable delay element 401 generates output signal 603 by delaying the input signal 601 in proportion to control signal 602.

The variable delay element of FIG. 6 functions as follows. Initially, all the logic signals are logic false. First, reset signal 605 goes logic true activating switch 620 which charges the capacitor 611 to reference voltage 604 and resets the regenerative flip-flop 612. The reference voltage 604 is the supply voltage plus the switch threshold voltage of switch 620. The normal supply line 606 may be used if it is sufficiently noise free and switch 620 produces no voltage drop that does not decrease to zero before the falling edge of reset signal 605. Signal 631 is the voltage across capacitor 611. The signal 631 is above logic true threshold for the regenerative flip-flop 612. When the input signal 601 goes logic true, switch 621 allows variable current source 610 to discharge capacitor 611. The voltage across the capacitor 611 decreases linearly with time. When the voltage across the capacitor crosses logic false threshold of flip-flop 612, the output of the flip-flop goes logic true. Therefore, the output signal 603 goes logic true after the input goes logic true representing a delay. The delay interval depends on the rate of discharge of the capacitor which is controlled by current through current source 610. The current through the current source 610 and therefore the delay, is controlled by the control signal 602.

In the preferred embodiment of the present invention, each delay element is identical, and therefore each delay interval is equal for a given control signal. With delay elements having equal delay intervals, the edges occur on integral fractions of the reference clock period. Variable delay elements with different delay interval may be constructed by varying the capacitance of capacitor 611. Using variable delay elements with different delay intervals, it is possible to construct the present invention to produce non-integral fractions of the reference clock period. The sum of the delay intervals of each variable delay element must equal one half of the period from the leading edge of the reference clock to the leading edge of the alternate clock signal.

Figure 7:
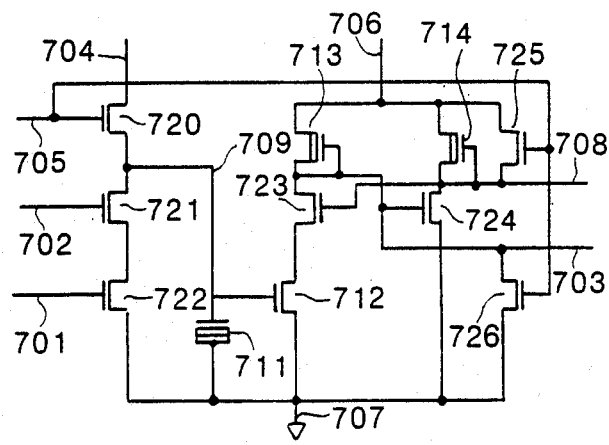
FIG. 7 is a schematic diagram of the variable delay element of FIG. 6.

FIG. 7 is a schematic diagram of the variable delay element. Integration of the variable delay element is important for many of the applications of the present invention in large digital system. The schematic diagram shows an implementation in NMOS technology, other technologies are equally useable and may be easily designed based on FIG. 7. The circuit is constructed from eight enhancement mode NMOS devices 712 and 720 through 726, one depletion mode NMOS device configured as capacitor 711 and two depletion mode NMOS devices 713 and 714 configured as pull-up loads.

Figure 8:
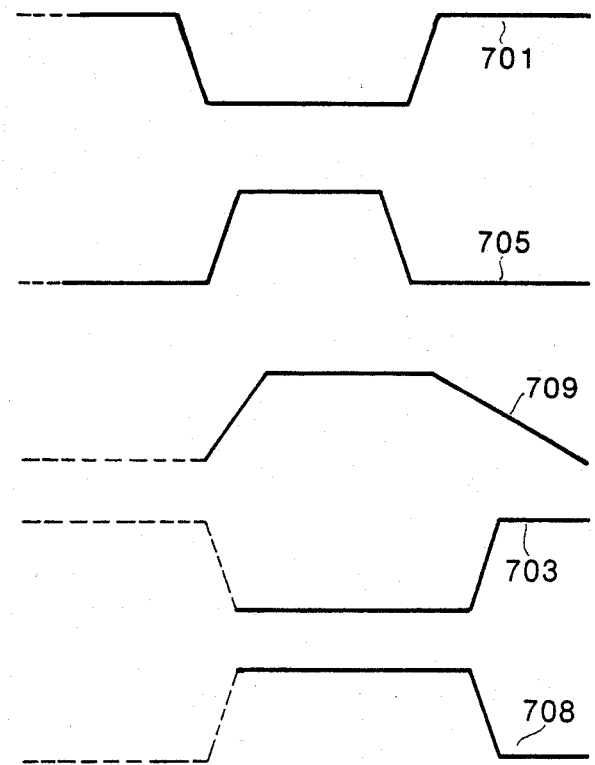
FIG. 8 is a timing diagram for the circuit shown in FIG. 7.

FIG. 8 is a timing diagram for the circuit shown in FIG. 7. The operation of the circuit may be better understood from studying the circuit in conjunction with the timing diagram. Signal 701 is the input signal which is a referece clock signal or a delayed reference clock signal. Signal 705 is the alternate clock signal used as the reset signal 605 in the discussion on FIG. 6 above. Signal 702 is the control signal. Signal 706 and 707 are Vdd and reference ground respectively. The circuit generates output signal 703 and its complement 708. Devices 720, 721 and 722 function as the current source and switches of FIG. 6. Devices 712, 713, 714, and 723 through 726 function as an regenerative latch similar to the regenerative flip-flop 612 of FIG. 6.

First, the rising edge of signal 705 resets the regenerative latch restoring 703 and 708 to their initial logic true and false states respectively. The rising edge of signal 705 also charges the capacitor 711 to its initial voltage equal to reference voltage 704. In the preferred embodiment, reference voltage 704 is constructed by on device filtering of supply line 706. The reset function of signal 705 ends with the falling edge of signal 705. When the rising edge of signal 701 occurs, the device 722 activates causing the charge on capacitor 711 to discharge through devices 721 and 722. The rate of discharge depends on the amount of current flowing through device 721 since 722 is driven to a low resistance. The rate of current flowing through 721 depends on the gate voltage of the device 721. The gate voltage is the control signal 702 which is proportional to the delay through the variable delay element. When the voltage on the capacitor 711 passes below the threshold voltage of device 712, the negative edge triggered regenerative latch formed by devices 713, 714, 723 and 724 latches signal 703 into the logic true state and signal 708 into logic false state. Finally, after the falling edge of signal 701, the rising edge of signal 705 again resets the regenerative latch, including signal 703 and 708. In this manner the circuit acts as a variable delay element.

Unequal time delays may be generated and controlled by the same logic signals by controlling the ratio of capacitance of capacitor 711 between multiple variable delay elements.

The control signal has a wide range of useable amplitudes. The maximum useable amplitude for the control signal causes the current source to act as a short giving the variable delay element its minimum delay of approximately the delay of the regenerative latch. The minimum useable amplitude for the control signal is the threshold voltage of device 721. With device 721 off, the maximum delay is then determined by the leakage of the particular implementation of the variable delay element.

Figure 9:
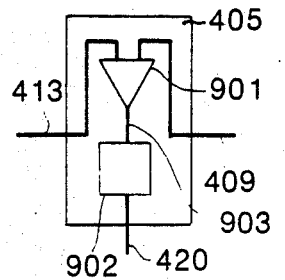
FIG. 9 is a functional block diagram of a comparator in accordance with the preferred embodiment of the present invention.

FIG. 9 is a functional block diagram of a comparator in accordance with the preferred embodiment of the present invention. The comparator 405 consists of comparison generator 901, and low pass filter 902. The comparator 405 is controlled by signal 413 and alternate clock 409. The comparison generator 901 operates by repeatedly comparing the generated signal 413 to the alternate clock signal 409 and generating a signal 903 which indicates whether the signal 413 leads, lags or equals the reference clock 410. The filter 902 low pass filters signal 903 to generate a control signal 420 which may be used to control, for example, a variable delay element.

Figure 10:
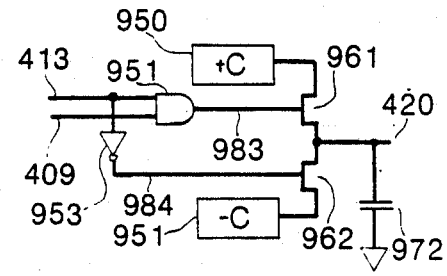
FIG. 10 is a detailed functional block diagram of a comparator of FIG. 9.

FIG. 10 is a detailed functional block diagram of a comparator 405 in accordance with the preferred embodiment of the present invention. The comparator consists of inverter 953, AND gate 951, switches 961 and 962, charge holders 950 and 951, and capacitor 972. The alternate clock signal 409 is ANDed with the signal 413 to generate signal 983. Signal 413 is inverted by inverter 953 to generate signal 984. The inverter 953 is not required in large digital systems because the complement of signal 413 is often available as it is from the flip-flop of FIG. 6.

Signal 983 activates switch 961. Signal 984 activates switch 962. Switch 961 is activated when the signal 413 lags the alternate clock signal 409. When switch 961 is activated, it transfers a positive charge C to the output signal 420 where it is held by capacitor 972. This charge causes the voltage of the control signal 420 to increase. This increase in control voltage may be used, for example, to decrease the delay of a variable delay element. Switch 962 is activated when signal 413 leads the reference clock signal 410. When switch 961 is activated, it draws a negative charge C through control line 420 from the capacitor 972. This charge causes the voltage of the control signal 420 to decrease. This decrease in control voltage may be used, for example, to increase the delay of a variable delay element. In this functional block diagram, the inverter 953 and AND gate 951 perform a function equivalent to the comparison generator 901 of FIG. 9, while charge elements 950 and 951, switches 961 and 962, and capacitor 972 perform a function equivalent to the low pass filter 902 of FIG. 9.

In the preferred embodiment of the present invention, the output signal of the final variable delay element will not make a complete transition when its output is coincident with the alternate clock signal, as shown in FIG. 2. This occurs because the alternate clock signal will reset the variable delay element before the signal has had time to go true. This causes both switches 961 and 962 to transfer equal amounts of charge thereby canceling out any effect on the control signal. This is more stable than, for example, a bang-bang approach that transfers charge either to or from the capacitor 972 thereby causing the control signal to overshoot around the lock on amplitude.

Figure 11:
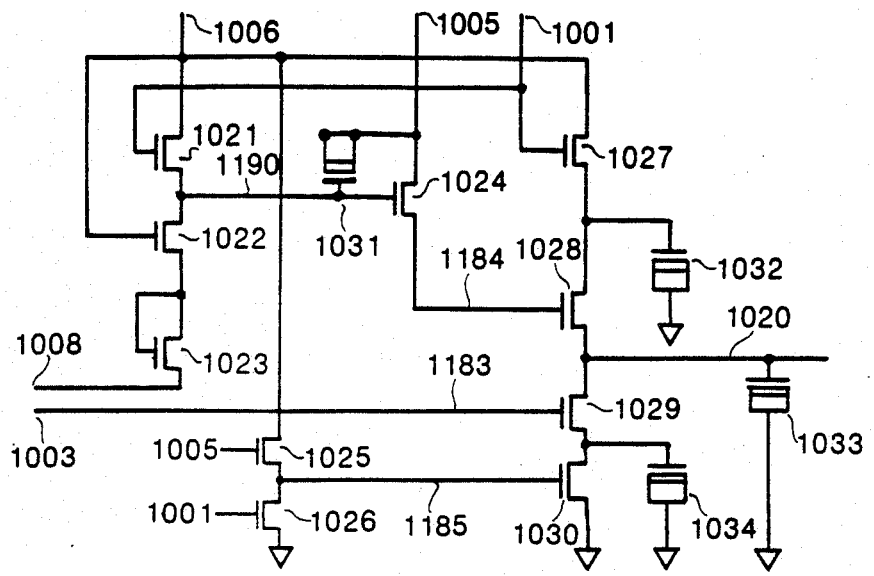
FIG. 11 is a schematic diagram of a comparator for use with the variable delay element of FIG. 7.

FIG. 11 is a schematic diagram of a comparator in accordance with the preferred embodiment of the present invention. Integration of the comparator is important for many of the applications of the present invention in large digital systems. The schematic diagram shows an implementation in NMOS technology. Other technologies are equally useable and may be easily designed based on FIG. 11. The circuit is constructed from ten enhancement mode NMOS devices 1021 through 1030 and four depletion mode MOS devices configured as capacitors 1031 through 1034. The circuit generates control signal 1020 from input signals: reference clock signal 1001, alternate clock signal 1005, supply voltage 1006, and generated signals 1003 and 1008. The generated signal 1003 and its complement, signal 1008, are comparable to the output signal 703 and its complement, signal 708, of FIG. 7.

Figure 12:
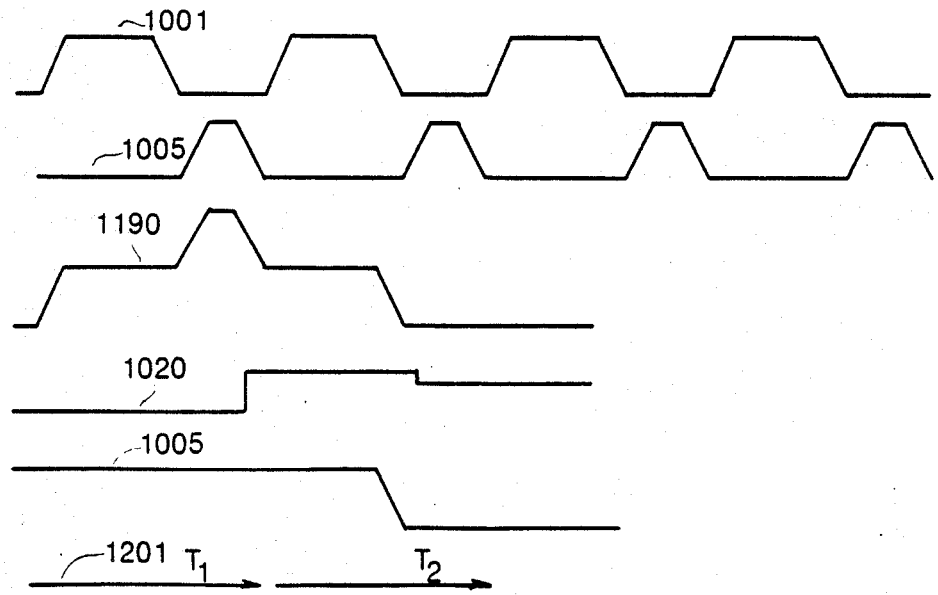
FIG. 12 is a timing diagram for the circuit shown in FIG. 11.

FIG. 12 is a timing diagram for the circuit shown in FIG. 11. The operation of the circuit may be better understood from studying the circuit and the timing diagram. This circuit functions similarly to the functional block diagram of FIG. 10. The comparator compares the alternate clock signal 1005 against the generated signal 1003. Signal 1003 is logic false, except for the period of time when the rising edge of signal 1003 leads the rising edge of the alternate clock signal 1005 when the signal 1003 will be logic true. The signal 1003 is connected directly to device 1029 and used to transfer charge from capacitor 1033 to capacitor 1034 threrby reducing the voltage of control signal 1020. Devices 1025 and 1030 are used to dump any charge which may have been transferred into capacitor 1034 to ground during the true state of signal 1005, a period of time when signal 1003 is reset to logic false. Device 1026 is used to turn off device 1030 by drawing the charge of its gate following the discharge of capacitor 1034.

The remaining part of the circuit is used to transfer charge from capacitor 1032 to capacitor 1033 when the generated signal 1003 lags the alternate clock signal 1005. The capacitor 1031 may be designed as part of an NMOS device 1024, but, is separated here as it is in the preferred embodiment. For the case when the generated signal 1003 lags the alternate clock signal 1005, signal 1008 is logic false or at Vdd when reference clock signal 1001 goes false and non-overlapping signal 1005 goes true. Initially, the rising edge of reference clock signal 1001 has turned on device 1021 placing a positive charge on capacitor 1031 with respect to alternate clock signal 1005 which is at ground potential. Reference clock signal 1001 then goes logic false and since signal 1008 is logic high both devices 1023 and 1022 are off permitting the charge to remain on capacitor 1031. Then, when the alternate clock signal 1005 goes logic true, the voltage at signal 1190 goes even further positive allowing device 1024 to pass signal 1005 through causing signal 1184 to transition to logic true which turns on device 1028 transferring the charge from capacitor 1032 to capacitor 1033. The ratio of capacitances between, not the absolute capacitance of, capacitors 1033, 1034 and 1032 controls the voltage change across capacitor 1033. Ratios of capacitances are easily controlled in integrated circuits. In the preferred embodiment, the ratio between 1033 and 1032 or 1034 is approximately 50 to 1. Device 1027 is used to charge the capacitor 1032 from the voltage supply 1006 during a period of time when signal 1005 is low and the device 1028 cannot be activated.

For the case when the generated signal 1003 leads the alternate clock signal 1005, the rising edge of reference clock signal 1001 turns on device 1021 placing a positive charge on capacitor 1031 with respect to alternate clock signal 1005. However, system clock 1001 then turns off switch 1021 and, since signal 1008 transistions to logic low before signal 1005, both switches 1023 and 1022 turn on and discharge capacitor 1031. Therefore when the alternate clock signal 1005 goes true, the voltage at signal 1190 is less than one threshold voltage above signal 1184 causing switch 1024 and switch 1028 to remain off. This prevents any charge from being transferred from capacitor 1032 to capacitor 1033.

The timing edges generated by the present invention may be made programmable by using programmable variable delay elements. Programmable variable delay elements may be constructed by using a programmable current source in place of fixed current source 610 or a programmable capacitor in place of fixed capacitor 611 of FIG. 6.

I claim:

1. An apparatus for generating a clock edge referenced to a clock, the apparatus comprising:
    first variable delay means having an input line to carry an input signal, an output line to carry an output signal and a control line to carry a control signal for delaying the input signal by a first delay interval to generate the output signal, the output signal being the clock edge, the input line connected to the clock, the first delay interval responsive to the control signal;
    second variable delay means having an input line to carry an input signal, an output line to carry an output signal and a control line to carry a control signal for delaying the input signal by a second delay interval to generate the output signal, the input line connected to the output line of the first variable delay means, the second delay interval responsive to the control signal; and
    comparator means having a first and second input line to carry a first and second signal and an output line to carry a control signal for comparing the first signal to the second signal and generating the control signal, the first input line connected to the clock, the second input line connected to the output line of the second variable delay means, the output line connected to the control line of the first and second variable delay means for increasing the first and second delay intervals if the second signal occurs before the first signal or decreasing the first and second delay intervals if the first signal occurs before the second signal.

2. An apparatus as in claim 1 for generating a second clock edge further comprising:
    third variable delay means having an input line to carry an input signal, an output line to carry an output signal and a control line to carry a control signal for delaying the input signal by a third delay interval to generate the output signal, the output signal being the second generated clock edge, the input line connected to the clock, the third delay interval responsive to the control signal, the output line connected to the input line of the first variable delay means.

3. An apparatus as in claim 1 wherein the first delay interval is equal to the second delay interval.

4. An apparatus as in claim 1 for generating high current clock edges further comprising:
    third variable delay means having an input line to carry an input signal, an output line to carry an output signal and a control line to carry a control signal for delaying the input signal by the first delay interval to generate the output signal, the input line connected to the clock, the first delay interval responsive to the control signal, the output signal being the high current clock edge.

5. A method for generating a clock edge referenced to a clock signal, the apparatus comprising:
    delaying the clock signal in proportion to a control signal to generate a first signal and the clock edge;
    delaying the first signal in proportion to a control signal to generate a second signal;
    comparing the second signal to the clock signal; and
    adjusting the control signal to increase the delay if the second signal leads the clock signal or decrease the delay if the second signal lags the clock signal.

6. A method as in claim 5 for generating additional clock edges further comprising:
    delaying the second signal in proportion to a control signal to generate a third signal and supplying the third signal in place of the second signal to the step of comparing and step of adjusting.

7. An apparatus for generating a clock edge referenced to a clock and alternate clock, the apparatus comprising:
    first variable delay means having an input line to carry an input signal, an output line to carry an output signal and a control line to carry a control signal for delaying the input signal by a first delay interval to generate the output signal, the output signal being the clock edge, the input line connected to the clock, the first delay interval responsive to the control signal;
    second variable delay means having an input line to carry an input signal, an output line to carry an output signal and a control line to carry a control signal for delaying the input signal by a second delay interval to generate the output signal, the input line conneced to the output line of the first variable delay means, the second delay interval responsive to the control signal; and
    comparator means having a first and second input line to carry a first and second signal and an output line to carry a control signal for comparing the first signal to the second signal and generating the control signal, the first input line connected to the alternate clock, the second input line connected to the output line of the second variable delay means, the control signal connected to the control line of the first and second variable delay means for increasing the first and second delay interval if the second signal occurs before the first signal or decreasing the first and second delay interval if the first signal occurs before the second signal.

8. An apparatus as in claim 7 wherein the comparator means further comprises:
    a flag generating means for comparing the first signal to the second signal and generating a first flag if the rising edge of the first signal leads the rising edge of the second signal, a second flag if the rising edge of the first signal lags the rising edge of the second signal, and a third flag if the rising edge occurs at the same time as the rising edge of the second signal; and
    a filter means for averaging the flags generated by the flag generating means.

9. An apparatus as in claim 7 wherein the first delay interval is equal to the second delay interval.

10. An apparatus as in claim 7 for generating high current clock edges further comprising:
    third variable delay means having an input line to carry an input signal, an output line to carry an output signal and a control line to carry a control signal for delaying an input signal by the first delay interval to generate the output signal, the input line connected to the clock, the first delay interval responsive to the control signal, the output signal being the high current clock edge.

11. A method for generating a clock edge referenced to a reference clock signal and an alternate clock signal, the apparatus comprising:
    delaying the reference clock signal in proportion to a control signal to generate a first signal and the clock edge;

delaying the first signal in proportion to a control signal to generate a second signal;

comparing the second signal to the alternate clock signal; and adjusting the control signal to increase the delay if the second signal leads the alternate clock signal or decrease the delay if the second signal lags the alternate clock signal.

* * * * *